United States Patent

Ohmi et al.

[11] Patent Number: 5,803,956
[45] Date of Patent: Sep. 8, 1998

[54] SURFACE TREATING COMPOSITION FOR MICRO PROCESSING

[75] Inventors: Tadahiro Ohmi, Sendai; Matagoro Maeno, Izumi; Hirohisa Kikuyama, Nara, all of Japan

[73] Assignee: Hashimoto Chemical Company, Ltd., Osaka-fu, Japan

[21] Appl. No.: 938,469

[22] Filed: Jan. 11, 1996

Related U.S. Application Data

[63] Continuation-in-part of Ser. No. 281,659, Jul. 28, 1994, abandoned.

[51] Int. Cl.$^6$ .................................................. C09K 13/08
[52] U.S. Cl. ........................................ 106/1.05; 106/1.11
[58] Field of Search ................................ 106/1.05, 1.11

[56] References Cited

U.S. PATENT DOCUMENTS

| 4,608,086 | 8/1986 | Dodge ........................................ 106/12 |
| 4,696,760 | 9/1987 | Morimoto et al. ...................... 252/314 |

FOREIGN PATENT DOCUMENTS

| 135586 | 7/1985 | Japan . |
| 219264 | 9/1986 | Japan . |
| 5-129264 | 5/1993 | Japan . |

*Primary Examiner*—Helene Klemanski
*Attorney, Agent, or Firm*—Nikaido Marmelstein Murray & Oram, LLP

[57] ABSTRACT

Hydrofluoric acid has incorporated therein a hydrocarbon nonionic surfactant having an HLB value of 7 to 17. The composition exhibits improved wetting and other properties for use in surface treatment for micro processing.

4 Claims, 2 Drawing Sheets

SURFACE TREATING COMPOSITION FOR MICRO PROCESSING

This is a Continuation-in-Part of application Ser. No. 08/281,659 filed Jul. 28, 1994, now abandoned.

BACKGROUND OF THE INVENTION

1. Field of the Invention

The present invention relates to surface treating compositions for micro processing, and more particularly to such a surface treating composition for use removing or etching an oxide film on silicon by the wet method, and cleaning the surface of silicon.

2. Description of the Prior Art

Hydrofluoric acid is used as a surface treating agent (hereinafter referred to briefly as a "treating solution") in fabricating semiconductor devices. While such treating solutions need to have a high purity and high cleanness in view of the purpose of the treatment, a perfect and comprehensive surface-treating function has further been required of the solution to produce semiconductor devices of higher integration density or complexity and higher performance in high yields.

Stated more specifically, the surface treating process, for example, for removing an oxide film from silicon surfaces is an important process which governs the quality of the fine circuit to be subsequently formed, and should completely uniformly perform a chemical action over the entire surface area of the silicon substrate. Furthermore, the process must produce a reliable cleaning effect to finish the resulting highly active surface to a flawless extremely smooth clean surface. Accordingly, it is essential that the surface to be treated be effectively wettable with hydrofluoric acid.

In the etching process for forming LSI circuits, the patterns used have become smaller and more complex with an increase in the density of integration, such that the micro processing can not be fabricated uniformly and perfectly over the entire grooved area unless hydrofluoric acid effectively penetrates into micro clearances or grooves and completely cleans the grooves through a chemical action. Thus, the wetting and penetrating properties are of extreme importance to the treating solution.

The grooves formed by patterning are conventionally cleaned with sulfuric acid-hydrogen peroxide aqueous solution, hydrochloric acid-hydrogen peroxide aqueous solution or ammonia water-hydrogen peroxide aqueous solution, whereas it is the necessary to remove the resulting oxide film. Hydrofluoric acid is a liquid of low viscosity and low surface tension (8.6 dynes/cm) when 100% in concentration, but the surface tension approaches that of water as is is diluted to a greater extent. Hydrofluoric acid has a contact angle of 58 to 76 degree on the surface of silicon, which is therefore difficult to wet with this acid. The surface tension is 50 to 73 dynes/cm. When thus having high surface tension and a great contact angle, dilute hydrofluoric acid is unable to uniformly penetrate onto micro grooves and encounters difficulty in treating finely processed surfaces as by etching or cleaning. Table 1 shows data as to the surface tension and contact angle. Also shown for reference is data as to ultrapure water. Table 1 shows the surface tension and contact angle of ultrapure water and hydrofluoric acid.

To evaluate the wettability of the surface of silicon, treating solutions as applied dropwise to the silicon surface were checked for contact angle by the liquid droplet method. The surface tension was measured by the vertical plate method.

TABLE 1

| | Surface tension (dyn/cm) | Contact angle on Silicon surface (degree) |
|---|---|---|
| Ultrapure water | 72.5 | 76 |
| 0.5% hydrofluoric acid | 71.7 | 76 |
| 5.0% hydrofluoric acid | 68.1 | 73 |
| 30% hydrofluoric acid | 58.6 | 65 |
| 50% hydrofluoric acid | 51.0 | 58 |

The surface tension is an action at a gasliquid interface, and the contact angle is an action at a solid-liquid interface, so that the wettability of silicon surface should of course be evaluated in terms of contact angle. As previously stated, the wetting property is an important function of the treating solution. Although addition of a surfactant is necessary to give a wetting property, some kinds of surfactants are likely to become adsorbed by the surface treated (silicon oxide film), failing to remove the oxide film. Measures for effectively improving the wetting property of the treating solution without adversely affecting the substantial function thereof have not been proposed and still remain to be developed.

Surfactants differ in chemical structure and in the mechanism of their activity. It is necessary to conduct a comprehensive investigation as to what surfactant is to be added to the treating solution to give a treating composition for micro processing (hereinafter referred to briefly as a "treating composition") which is suitable for use in semiconductor fabrication processes, and also as to what influence the presence of a particular surfactant produces on the properties of the treating composition.

We have conducted detailed research on the phenomena resulting from the addition of surfactants to the treating solution and found the following problems.

1. When added, the surfactant readily reduces the surface tension of the treating solution but does not always diminish the contact angle on the surface of silicon. In other words, the treating composition does not always effectively wet the silicon surface or smoothly penetrate into micro clearances.

2. In the case where the treating solution, which contains the surfactant as dispersed therein without dissolving, is subjected to circulating filtration which is generally practiced in semiconductor fabrication processes to remove particles from the solution, the surfactant is adsorbed and trapped by the filter to result in lowered activity (increase in surface tension or contact angle) not infrequently. It is further likely that the surfactant, if dissolving in the treating solution immediately after addition, will separate from the solution in a long period of time to entail impaired activity.

3. The addition or the surfactant is likely to increase the number of particles in the treating composition or to increase the amount of impurities, such as alkali metals, alkaline earth metals or heavy metals, which are said to exert an adverse effect on semiconductor devices. This phenomenon leads to an increased likelihood of particles becoming deposited on the silicon surface or in micro processed clearances, and also contributes to the impairment of performance of semiconductor devices due to impurities.

4. Addition of an excess of surfactant often produces an excessive amount of micelles in the treating composition, causing various troubles to the micro processing as will be described below.

(a) Micelles of the surfactant adhere to the surface to be etched, causing irregular or imperfect etching.
(b) Micelles adhere to the surface of silicon when wafers are withdrawn from the treating composition to create stains or cause hazing of the water surface, which then scatters a laser beam when the surface is observed by a wafer inspection system.
(c) Addition of an excess of the surfactant causes troubles such as frothing to the waste treatment process for the treating composition.

Thus, the addition of surfactants, although necessary to improve the wetting property of the treating solution, at the same time entails the likelihood of adversely affecting the important functions of the treating composition.

The cleaning step included in semiconductor fabrication processes and executed with use of hydrofluoric acid is very important, and attention has been directed especially to the smoothness of cleaned surfaces as a critical factor in submicron devices.

However, when the surfaces of silicon wafers as cleaned with hydrofluoric acid were observed under an Atomic Force Microscope (AFM) at an atom discernible magnification, the surface smoothness was found to be impaired. Silicon wafers become rough-surfaced also when etched with use of buffered hydrofluoric acid (acid mixture of hydrofluoric acid and ammonium fluoride in a suitable ratio). Techniques for ensuring smoothness by incorporating a suitable surfactant into treating solutions have been developed as disclosed, for example, in Unexamined Japanese Patent Publications 1988-283028 and 1991-179737. Nevertheless, even it the surfactant added to the buffered hydrofluoric acid is added to hydrofluoric acid, the contemplated effect is not available. Conversely, observation under AFM has revealed that some silicon wafers, for example, P-type (100) wafers, become rough-surfaced when immersed in the resulting composition for at least 30 minutes.

Such a surface defect becomes a serious objection in integrated circuits of high complexity, for example, in forming shallow junctions. Accordingly, it is extremely important to develop means for giving a wetting property to the treating solution to obtain surface smoothness also in cleaning silicon surfaces with hydrofluoric acid.

There are a wide variety of surfactants, which are divined generally into hydrocarbon surfactants and fluorine-containing surfactants. Each of these types include cationic, anionic, amphoteric and nonionic surfactants. Although Unexamined Japanese Patent Publication 1989-183824 discloses that any surfactants are useful insofar as they are of the hydrocarbon type, this is not true of the application contemplated by the present invention.

The surfactants used in Unexamined Japanese Patent Publications 1983-55323 and 1983-42019 include those increasing the number of particles that will adhere to the surface of silicon and those roughing silicon surfaces, such as primary amine salts, secondary amine salts, tertiary amine salts and quaternary ammonium salts. These surfactants are not suited to use in etching or cleaning agents for silicon and silicon oxide films.

Dodecylbenzenesulfonic acid used in Unexamined Japanese Patent Publication 1986-203800 has exceedingly high ability to froth and therefore the drawback of being liable to pose problems such as etching faults in semiconductor fabrication processes.

Examined Japanese Patent Publication 1992-16011 discloses a method of etching a silicon oxide film formed on the bottom surfaces of micro groove of 1 to 5 $\mu$m square with a composition comprising hydrofluoric acid and a nonionic surfactant added thereto. Although polyethylene glycol lauryl ether, polyethylene glycol alkylphenyl ethers and polyethylene glycol fatty acid esters are given in the publication as examples or nonionic surfactants, the sole example of composition mentioned is one comprising, hydrofluoric acid diluted to a ratio of 1:20 and 1 vol. % of polyethylene glycol lauryl ether added thereto. Presently, with advances made in integrated circuits of high complexity, the size of micro groove or line width to be etched are not larger 1 $\mu$m. The treating composition of Examined Patent Publication 1992-16011 is not serviceable as such in the current stage of progress in circuits of high complexity, and there is a need to use compositions fulfilling more stringent requirements as to surface tension, contact angle and characteristics to be described herein. Thus, surfactants suited to the fabrication of advanced semiconductor devices of higher integration density or complexity can not be selected from among those which are disclosed in the publication 1992-16011 and which are not suitable for use in etching agents and cleaning agents.

There are cases wherein IPA (isopropyl alcohol) or the like is added in an amount of about 10% in treating solution to give reduced surface tension, whereas problems then arise in treating the resulting waste water. Accordingly, unless the surfactant to be used is effective in a small amount, the contemplated object is not attainable.

Hydrofluoric acid is used generally at a concentration, for example, of 0.5 wt. % or 5 wt. %. However, since it is not economical to commercially prepare such hydrofluoric acid, it is desired to prepare hydrofluoric acid having a concentration of 50 wt. % which remains unchanged in activity when diluted for use.

SUMMARY OF THE PRESENT INVENTION

To overcome the problems relating to the treating composition, we have conducted careful technical investigations and carried out experiments with meticulous consideration given thereto from the viewpoint of cleaning technology. Surfactants are used for a very wide variety of applications under diversified conditions, and are divided generally into hydrocarbon surfactants and fluorine-containing surfactants. These two types are further divided into cationic, anionic, amphoteric and nonionic types.

Each of these types includes many compounds each having characteristic surface activity. We have conducted investigations to select surfactants suited to the object of the invention, and selected those which are satisfactory in all the items (1) to (6) given below from among these surfactants. The treating composition incorporating such a surfactant is used mainly for the purpose of etching a silicon oxide film, or removing an oxide film as formed over the entire surface of a silicone wafer or in etched grooves therein when the wafer is cleaned with sulfuric acid-hydrogen peroxide aqueous solution, hydrochloric acid-hydrogen peroxide aqueous solution or ammonia-hydrogen peroxide aqueous solution or when the wafer is further washed with ultrapure water. Accordingly, the treating composition was checked for repellency on the wafer to ascertain whether the presence of the surfactant is not detrimental to the contemplated effect (7).

(1) Reduction in the number of particles present in treating composition
(2) Silicon surface wetting property of treating composition and property thereof to penetrate into contact grooves and via grooves
(3) Smoothness of silicon surface
(4) Diminished adhesion of particles to silicon surface (5) Stability of treating composition
(6) High purity of treating composition
(7) Silicon surface cleaning effect or oxide film etching effect

The following check means or methods were used to quantitatively evaluate the suitability of the surfactant to be incorporated into treating compositions fulfilling the above seven requirements. The treating solutions used for testing were 0.5 wt. %, 5 wt. % and 50 wt. % in the concentration of hydrofluoric acid.

(1) Reduction in the number of particles present in treating composition

Figure 1:
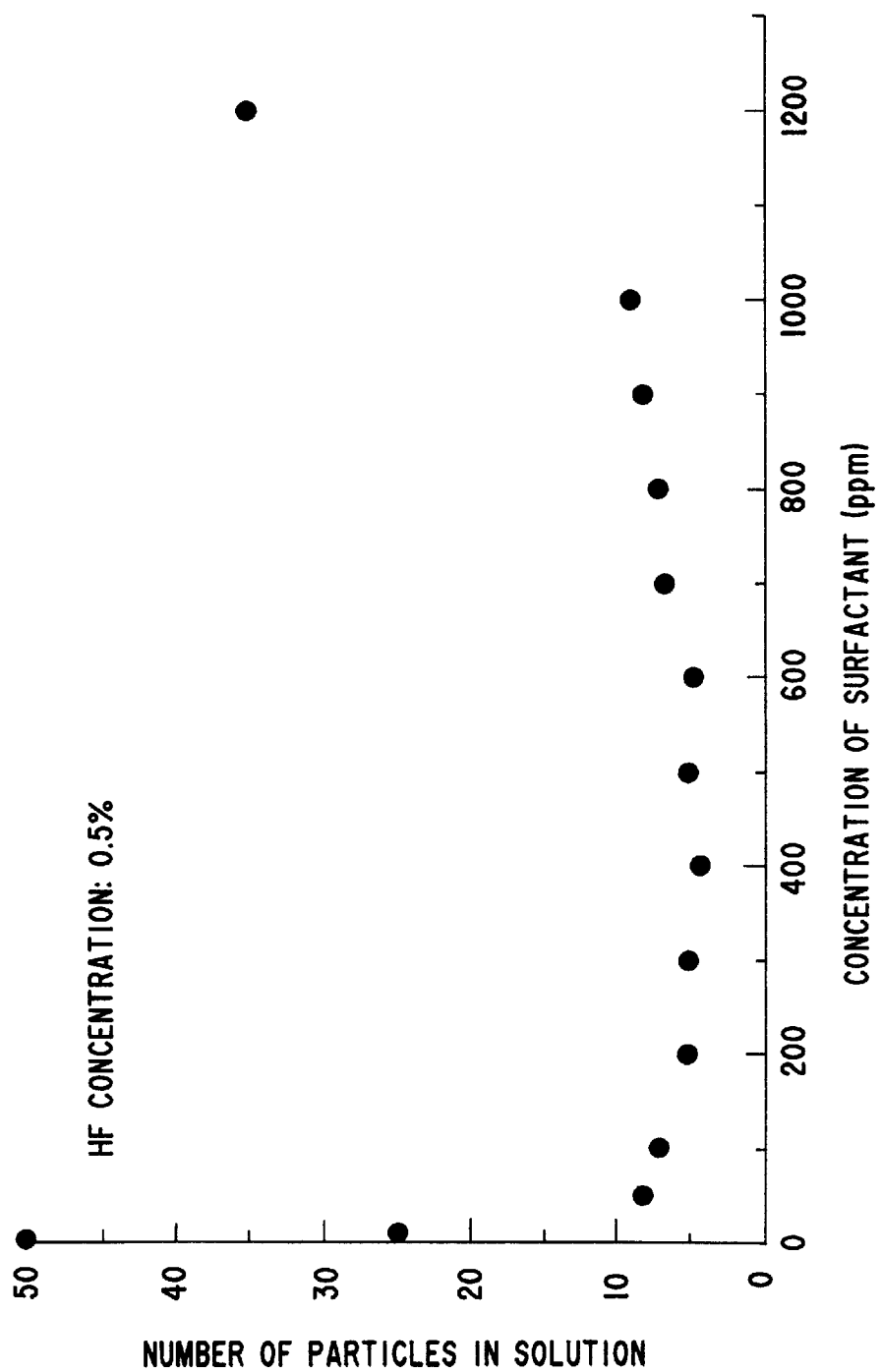
FIG. 1 is a diagram showing the relationship between the concentration of surfactants and the number of particles in a solution.

Being low in particle content is one of the important properties required of the treating composition for use in surface treating processes for micro processing because improper etching due to the presence of particles is a great factor to result in a lower yield in semiconductor fabrication. As shown in FIG. 1, there are surfactants which reduce the number of particles present in the treating solution when added to the solution, followed by circulating filtration. However, the mechanism of reduction in the number of particles or particle content still remains to be clarified. FIG. 1 is a diagram showing the relationship between the concentration of surfactants and the number of particles present in the solution which is 0.5 wt. % in HF concentration.

There are very large number of surfactants which fail to reduce the number of particles in the treating composition which is prepared by addition of the surfactant and circulating filtration. These surfactants are not suited to the object of the invention. To find out surfactants which attain the object, we investigated various surfactants (hydrocarbon type and fluorine-containing type including nonionic, anionic, cationic and amphoteric surfactants). The results is shown in Tables 2 to 14, in which the compounds of the same kind but different in molecular weight are designated by A, B, C, .... These symbols A to H in Tables 2 to 14 stand for the following surfactants.

A: hydrocarbon nonionic surfactant
B: hydrocarbon anionic surfactant
C: hydrocarbon cationic surfactant
D: hydrocarbon amphoteric surfactant
E: fluorine-containing nonionic surfactant
F: fluorine-containing anionic surfactant
G: fluorine-containing cationic surfactant
H: fluorine-containing amphoteric surfactant

TABLE 2

| | Substance | Number of particles >0.5 μm (per ml) | Acceptability | Kind |
|---|---|---|---|---|
| Polyoxy-ethylene alkyl ether | Polyoxyethylene lauryl ether A | 4 | Acceptable | A |
| | Polyoxyethylene alkyl ether B | 8 | Acceptable | A |
| | Polyoxyethylene nonylphenyl ether A | 5 | Acceptable | A |
| | Polyoxyethylene nonylphenyl ether B | 8 | Acceptable | A |

TABLE 2-continued

| Substance | Number of particles >0.5 μm (per ml) | Acceptability | Kind |
|---|---|---|---|
| Polyoxyethylene nonylphenyl ether C | 3 | Acceptable | A |
| Polyoxyethylene alkylphenyl ether A | 8 | Acceptable | A |
| Polyoxyethylene alkylphenyl ether B | 4 | Acceptable | A |
| Polyoxyethylene octylphenyl ether | 5 | Acceptable | A |
| Polyoxyethylene oleyl ether | 3 | Acceptable | A |
| Polyoxyethylene alkylallyl ether A | 7 | Acceptable | A |
| Polyoxyethylene alkylallyl ether B | 7 | Acceptable | A |
| Polyoxyalkylene alkyl ether | 8 | Acceptable | A |
| Polyoxyethylene higher alcohol ether A | 9 | Acceptable | A |
| Polyoxyethylene higher alcohol ether B | 4 | Acceptable | A |

TABLE 3

| | Substance | Number of particles >0.5 μm (per ml) | Acceptability | Kind |
|---|---|---|---|---|
| Nonionic surfactant | Polyoxyethylene derivative | 9 | Acceptable | A |
| | Polyoxyethylene derivative A | 7 | Acceptable | A |
| | Polyoxyethylene derivative B | 7 | Acceptable | A |
| | Polyoxyethylene derivative C | 8 | Acceptable | A |
| | Specified non-ionic surfactant | 8 | Acceptable | A |
| | Specified non-ionic surfactant | 8 | Acceptable | A |
| | Specified ether nonionic surfactant A | 28 | Unacceptable | A |
| | Specified ether nonionic surfactant B | 34 | Unacceptable | A |
| | Specified ether nonionic surfactant C | 54 | Unacceptable | A |
| | Specified ether nonionic surfactant D | 19 | Unacceptable | A |
| | Mixture of specified surfactants | 19 | Unacceptable | A |
| Sorbitan fatty acid ester | Sorbitan monooleate A | 8 | Acceptable | A |
| | Sorbitan monooleate B | 2 | Acceptable | A |
| | Sorbitan sesquioleate | 5 | Acceptable | A |
| | Sorbitan monolaureate | 2 | Acceptable | A |
| | Sorbitan sesquioleate | 1 | Acceptable | A |
| Polyoxyethylene sorbitan fatty acid ester | Polyoxyethylene sorbitan fatty acid ester (laureate) | 1 | Acceptable | A |

TABLE 4

| | Substance | Number of particles >0.5 μm (per ml) | Acceptability | Kind |
|---|---|---|---|---|
| Fatty acid monoglyceride | Monoglycerol ester | 8 | Acceptable | A |
| Polyalkylene glycol | Polyoxyalkylene glycol derivative A | 8 | Acceptable | A |
| | Polyoxyalkylene glycol derivative B | 7 | Acceptable | A |
| | Polyoxyalkylene glycol derivative C | 9 | Acceptable | A |
| | Polyoxyalkylene glycol derivative D | 5 | Acceptable | A |
| | Polyoxyalkylene glycol A | 4 | Acceptable | A |
| | Polyoxyalkylene glycol B | 6 | Acceptable | A |
| | Polyethylene glycol ester | 2 | Acceptable | A |
| | Polyethylene glycol A | 1 | Acceptable | A |
| | Polyethylene glycol B | 1 | Acceptable | A |
| | Polyglycol type product A | 3 | Acceptable | A |
| | Polyglycol type product B | 3 | Acceptable | A |
| | Polyglycol type product C | 5 | Acceptable | A |
| | Polyglycol type product D | 5 | Acceptable | A |

TABLE 5

| | Substance | Number of particles >0.5 μm (per ml) | Acceptability | Kind |
|---|---|---|---|---|
| Polyoxyethylene fatty acid ester | Polyethylene glycol fatty acid ester | 8 | Acceptable | A |
| | Polyoxyethylene oleic acid ester A | 8 | Acceptable | A |
| | Polyoxyethylene oleic acid ester B | 7 | Acceptable | A |
| | Polyoxyethylene oleic acid ester C | 8 | Acceptable | A |
| | Polyoxyethylene oleic acid ester D | 7 | Acceptable | A |
| | Polyoxyethylene oleic acid ester E | 8 | Acceptable | A |
| | Polyoxyethylene fatty acid ester | 8 | Acceptable | A |
| Alcohol | Octanol | 8 | Acceptable | A |
| | Nonanol | 8 | Acceptable | A |
| | Lauryl alcohol | 7 | Acceptable | A |
| | Lanolin alcohol | 7 | Acceptable | A |
| Block polymer | Polyoxyethylene polyoxypropylene block polymer A | 5 | Acceptable | A |
| | Polyoxyethylene polyoxypropylene block polymer B | 5 | Acceptable | A |
| | Polyoxyethylene polyoxypropylene block polymer C | 8 | Acceptable | A |
| | Polyoxyethylene polyoxypropylene block polymer D | 8 | Acceptable | A |

TABLE 6

| | Substance | Number of particles >0.5 μm (per ml) | Acceptability | Kind |
|---|---|---|---|---|
| Fatty acid and salt thereof | Valeric acid | 8 | Acceptable | B |
| | Caproic acid | 7 | Acceptable | B |
| | Enanthic acid | 6 | Acceptable | B |
| | Caprylic acid | 10 | Acceptable | B |
| | Pelargonic acid | 11 | Unacceptable | B |
| | Capric acid | 12 | Unacceptable | B |
| | Lauric acid | 20 | Unacceptable | B |
| | Fatty acid type | 15 | Unacceptable | B |
| Alkyl sulfate ester salt | Alkyl sulfonate | 25 | Unacceptable | B |
| | Higher alcohol sodium sulfate | 11 | Unacceptable | B |
| | Lauryl sulfate triethanol amine | 15 | Unacceptable | B |
| Alkylbenzen sulfonate | Dodecylbenzene sulfonic acid sodium A | 5 | Acceptable | B |
| | Dodecylbenzene sulfonic acid sodium B | 5 | Acceptable | B |
| | Dodecylbenzene sulfonic acid | 3 | Acceptable | B |
| Dialkyl sulfosuccinic acid | Dialkyl sulfosuccinic acid sodium A | 12 | Unacceptable | B |
| | Dialkyl sulfosuccinic acid sodium B | 20 | Unacceptable | B |
| | Dialkyl sulfosuccinic acid ester sodium salt | 55 | Unacceptable | B |

TABLE 7

| | Substance | Number of particles >0.5 μm (per ml) | Acceptability | Kind |
|---|---|---|---|---|
| Polyoxyethylene alkyl and alkylallyl ether sulfuric acid ester salt | Polyoxyethylene alkylphenyl ether ammonium sulfate A | 18 | Unacceptable | B |
| | Polyoxyethylene alkylphenyl ether ammonium sulfate A | 36 | Unacceptable | B |
| Carboxylic acid type highpolymer | Polycarboxylic acid ammonium salt | 25 | Unacceptable | B |
| Other | Alkyl diphenyl ether disulfonate | 88 | Unacceptable | B |
| | Oleayl sarcosine | 55 | Unacceptable | B |
| | A mixture of acylmethyl taurinic acid sodium and anionic surfactant | 36 | Unacceptable | B |
| | Addition product of anionic surfactant | 22 | Unacceptable | B |

TABLE 8

| Substance | | Number of particles >0.5 μm (per ml) | Acceptability | Kind |
|---|---|---|---|---|
| Alkylamine salt | Heptylamine | 5 | Acceptable | C |
| | Dimethyloctylamine | 8 | Acceptable | C |
| | Benzylamine | 8 | Acceptable | C |
| | Coconut-amine acetate | 25 | Unacceptable | C |
| | Laurylamine | 55 | Unacceptable | C |
| | Octylamine | 26 | Unacceptable | C |
| | Trioctylamine | 12 | Unacceptable | C |
| | Amylamine | 15 | Unacceptable | C |
| | Hexylamine | 11 | Unacceptable | C |
| | Cyclohexylamine | 23 | Unacceptable | C |
| Quaternary ammonium salt | Alkylbenzyldimethyl-ammonium chloride | 18 | Unacceptable | C |
| | Dodecyltrimethyl-ammonium chloride | 18 | Unacceptable | C |
| | Lauryltrimethyl-ammonium chloride | 19 | Unacceptable | C |
| | $(RN^+(CH_3)_2CH_2{-}C_6H_6)Cl^-$ | 33 | Unacceptable | C |
| Other | | 25 | Unacceptable | C |

TABLE 9

| Substance | | Number of particles >0.5 μm (per ml) | Acceptability | Kind |
|---|---|---|---|---|
| Alkyl-betaine | Dimethylalkyl-betaine | 69 | Unacceptable | D |
| Imidazol-inium betain | 2-alkyl-N-carbox-ylalkyl-N-hydroxyethyl imidazolinium betain | 55 | Unacceptable | D |
| Other | | 59 | Unacceptable | D |

TABLE 10

| Substance | | Number of particles >0.5 μm (per ml) | Acceptability | Kind |
|---|---|---|---|---|
| Ethyleneoxide addition product | Perfluoro ethylene-oxide addition product A | 8 | Acceptable | E |
| | Perfluoro ethylene-oxide addition product B | 5 | Acceptable | E |
| | Perfluoro ethylene-oxide addition product C | 6 | Acceptable | E |
| | Perfluoro ethylene-oxide addition product D | 7 | Acceptable | E |
| Ester | Perfluoro alkyl ester A | 8 | Acceptable | E |
| | Perfluoro alkyl ester B | 7 | Acceptable | E |
| Amine oxide | Perfluoro alkyl amine oxide | 6 | Acceptable | E |
| Alcohol | Fluoro alcohol | 3 | Acceptable | E |
| Other | $R_1C_2H_4O(C_2H_4O)_xH$ | 10 | Acceptable | E |

TABLE 11

| Substance | | Number of particles >0.5 μm (per ml) | Acceptability | Kind |
|---|---|---|---|---|
| Carboxylic acid | Perfluoro alkyl carboxylic acid A | 2 | Acceptable | F |

TABLE 11-continued

| Substance | | Number of particles >0.5 μm (per ml) | Acceptability | Kind |
|---|---|---|---|---|
| and carbonate | Perfluoro alkyl carboxylic acid B | 2 | Acceptable | F |
| | Perfluoro alkyl carbonate A | 5 | Acceptable | F |
| | Perfluoro alkyl carbonate B | 4 | Acceptable | F |
| | Perfluoro alkyl carbonate C | 36 | Unacceptable | F |
| | Perfluoro alkyl carboxylic acid pottasium | 12 | Unacceptable | F |
| | Perfluoro alkyl carboxylic acid ammonium | 15 | Unacceptable | F |
| Sulfonic acid | Perfluoro alkyl sulfonic acid pottasium | 36 | Unacceptable | F |
| | Perfluoro alkyl sulfonic acid sodium | 22 | Unacceptable | F |
| | Perfluoro alkyl sulfonic acid lithium | 23 | Unacceptable | F |
| | Perfluoro alkyl sulfonic acid ammonium A | 23 | Unacceptable | F |
| | Perfluoro alkyl sulfonic acid ammonium B | 89 | Unacceptable | F |
| | Perfluoro alkyl sulfonic acid ammonium C | 77 | Unacceptable | F |
| | Perfluoro alkyl sulfonic acid ammonium D | 12 | Unacceptable | F |
| | Perfluoro alkyl sulfonate A | 55 | Unacceptable | F |
| | Perfluoro alkyl sulfonate B | 56 | Unacceptable | F |

TABLE 12

| | Substance | Number of particles >0.5 μm (per ml) | Acceptability | Kind |
|---|---|---|---|---|
| Phosphate ester | Perfluoro alkyl phosphate ester A | 89 | Unacceptable | F |
| | Perfluoro alkyl phosphate ester B | 12 | Unacceptable | F |
| Other | $C_8F_{17}SO_2N(C_3H_7)C_2H_4OP(OH)$ | 23 | Unacceptable | F |
| | $R_1C_2H_4SC_2H_4CO_2Li$ | 55 | Unacceptable | F |
| | $R_1C_2H_4OPO(ONH_4)_2$ | 55 | Unacceptable | F |
| | $R_1C_2H_4OPO(ONH_4)_2$ + Non Fluorinated Surfactant | 77 | Unacceptable | F |
| | $R_1SO_2NRCH_2COOK$ | 15 | Unacceptable | F |
| | Mixture of amide type substances | 89 | Unacceptable | F |
| | Mixture of alcohol and sulfonate | 99 | Unacceptable | F |
| | $(R_1SO_2NRC_2H_4O)_2PO(ONH_4)$ | 46 | Unacceptable | F |

TABLE 13

| | Substance | Number of particles >0.5 μm (per ml) | Acceptability | Kind |
|---|---|---|---|---|
| Alkylamine salt | Perfluoro alkyl trimethyl ammonium salt | 11 | Unacceptable | G |
| Quaternary ammonium salt | Perfluoro alkyl ammonium iodide A | 8 | Acceptable | G |
| | Perfluoro alkyl ammonium iodide B | 2 | Acceptable | G |
| | Perfluoro alkyl ammonium salt | 8 | Acceptable | G |
| Other | $R_1C_2H_4SC_2H_4N(CH_3)_3CH_3SO_4$ | 56 | Unacceptable | G |
| | $R_1SO_2NRC_2H_4N^+(CH_3)_3I^-$ | 66 | Unacceptable | G |

TABLE 14

| | Substance | Number of particles >0.5 μm (per ml) | Acceptability | Kind |
|---|---|---|---|---|
| Alkyl-betaine | Perfluoro alkyl betaine A | 15 | Unacceptable | H |
| | Perfluoro alkyl betaine B | 55 | Unacceptable | H |
| | Perfluoro alkyl betaine C | 66 | Unacceptable | H |
| | Perfluoro alkyl betaine D | 12 | Unacceptable | H |

The surfactant was evaluated as being satisfactory for the object of the invention when giving a treating composition wherein the number of particles 0.5 μm and larger was up to 10 pieces/ml. FIG. 1 shows the relationship between the concentration of surfactants and the number of particles in the solution.

The number of particles in the treating composition was measured by a laser liquid-borne particle counter after the composition was subjected to 24 cycles of circulating filtration at a flow rate of 750 kg/m²·hr using a fluorocarbon resin filter with a pore size of 0.1 μm.

(2) Silicon surface wetting property of treating composition and property thereof to penetrate into contact grooves and via grooves.

The treating composition was checked for silicon surface wetting property and property to penetrate into small patterns formed on silicon surfaces. Consequently, we found that when silicon wafers were dipped in the treating composition, the composition failed to smoothly wet the silicon surface unless the composition had a contact angle of not larger than 50 degree on the silicon surface and surface tension of not greater than 45 dynes/cm.

The composition was unable to smoothly penetrate into small patterns of up to 10 μm and to properly etch a silicon oxide film, confirmed by sectional photographs obtained with use of an electron microscope and observation under AFM.

The hydrocarbon surfactants and fluorine-containing surfactants include a considerably large number of those which give the treating solution a contact angle of up to 50 degree and surface tension of up to 45 dynes/cm when added to the solution. These surfactants are evaluated as being suitable for the object of the invention if the treating compositor still retains these properties after circulating filtration at a concentration of up to 1000 ppm at which no trouble occurs due to excessive use of the surfactant.

Accordingly, the surfactants which were found acceptable in respect of the item (1) were checked for the present item (2). The result is given in Tables 15 to 23, wherein the symbols A to H each have the same meaning as above.

Surface tension is measured at 20° C.

TABLE 15

| | Substance | Surface tension (dyne/cm) | Contact angle | Acceptability | Kind |
|---|---|---|---|---|---|
| Polyoxyethylene alkyl ether | Polyoxyethylene lauryl ether | 40 | 45 | Acceptable | A |
| | Polyoxyethylene alkyl ether | 36 | 40 | Acceptable | A |
| | Polyoxyethylene nonylphenyl ether A | 33 | 40 | Acceptable | A |

TABLE 15-continued

| Substance | Surface tension (dyne/cm) | Contact angle | Acceptability | Kind |
|---|---|---|---|---|
| Polyoxyethylene nonylphenyl ether B | 36 | 41 | Acceptable | A |
| Polyoxyethylene nonylphenyl ether C | 38 | 42 | Acceptable | A |
| Polyoxyethylene alkylphenyl ether A | 39 | 48 | Acceptable | A |
| Polyoxyethylene alkylphenyl ether B | 44 | 48 | Acceptable | A |
| Polyoxyethylene octylphenyl ether | 41 | 49 | Acceptable | A |
| Polyoxyethylene alkylallyl ether A | 44 | 49 | Acceptable | A |
| Polyoxyethylene alkylallyl ether B | 37 | 42 | Acceptable | A |
| Polyoxyethylene oleyl ether | 35 | 45 | Acceptable | A |
| Polyoxyealkylene alkyl ether | 38 | 45 | Acceptable | A |
| Polyoxyethylene higher alcohol ether B | 41 | 41 | Acceptable | A |
| Polyoxyethylene higher alcohol ether B | 39 | 42 | Acceptable | A |

TABLE 16

|  | Substance | Surface tension (dyne/cm) | Contact angle | Acceptability | Kind |
|---|---|---|---|---|---|
| Nonionic surfactant | Polyoxyethylene derivative | 44 | 48 | Acceptable | A |
|  | Polyoxyethylene derivative A | 44 | 49 | Acceptable | A |
|  | Polyoxyethylene derivative B | 44 | 49 | Acceptable | A |
|  | Polyoxyethylene derivative C | 44 | 48 | Acceptable | A |
|  | Specified nonionic surfactant | 49 | 52 | Unacceptable | A |
|  | Specified nonionic surfactant | 58 | 65 | Unacceptable | A |
| Sorbitan fatty acid ester | Sorbitan monooleate A | 40 | 48 | Acceptable | A |
|  | Sorbitan monooleate B | 41 | 49 | Acceptable | A |
|  | Sorbitan sesquioleate | 42 | 49 | Acceptable | A |
|  | Sorbitan monolaureate | 38 | 49 | Acceptable | A |
|  | Sorbitan sesquioleate | 35 | 47 | Acceptable | A |
| Polyoxyethylene sorbitan fatty acid ester | Polyoxyethylene sorbitan fatty acid ester (laureate) | 41 | 47 | Acceptable | A |
| Fatty acid monoglyceride | Monoglycerol ester | 44 | 49 | Acceptable | A |

TABLE 17

|  | Substance | Surface tension (dyne/cm) | Contact angle | Acceptability | Kind |
|---|---|---|---|---|---|
| Polyalkylene glycol | Polyoxyalkylene glycol derivative A | 41 | 44 | Acceptable | A |
|  | Polyoxyalkylene glycol derivative B | 40 | 45 | Acceptable | A |
|  | Polyoxyalkylene glycol derivative C | 43 | 48 | Acceptable | A |
|  | Polyoxyalkylene glycol derivative D | 39 | 49 | Acceptable | A |
|  | Polyoxyalkylene glycol A | 38 | 42 | Acceptable | A |
|  | Polyoxyalkylene glycol B | 41 | 48 | Acceptable | A |
|  | Polyethylene glycol ester | 41 | 49 | Acceptable | A |
|  | Polyethylene glycol A | 44 | 65 | Unacceptable | A |
|  | Polyethylene glycol B | 44 | 65 | Unacceptable | A |
|  | Polyglycol type product A | 41 | 55 | Unacceptable | A |
|  | Polyglycol type product B | 42 | 55 | Unacceptable | A |
|  | Polyglycol type product C | 41 | 51 | Unacceptable | A |
|  | Polyglycol type product D | 39 | 52 | Unacceptable | A |

TABLE 18

|  | Substance | Surface tension (dyne/cm) | Contact angle | Acceptability | Kind |
|---|---|---|---|---|---|
| Polyoxyethylene fatty acid ester | Polyethylene glycol fatty acid ester | 41 | 48 | Acceptable | A |
|  | Polyoxyethylene oleic acid ester A | 42 | 45 | Acceptable | A |
|  | Polyoxyethylene oleic acid ester B | 42 | 48 | Acceptable | A |
|  | Polyoxyethylene oleic acid ester C | 44 | 47 | Acceptable | A |
|  | Polyoxyethylene oleic acid ester D | 43 | 49 | Acceptable | A |
|  | Polyoxyethylene oleic acid ester E | 44 | 45 | Acceptable | A |
|  | Polyoxyethylene fatty acid ester | 44 | 47 | Acceptable | A |
| Alcohol | Octanol | 41 | 64 | Unacceptable | A |
|  | Nonanol | 44 | 51 | Unacceptable | A |
|  | Lauryl alcohol | 50 | 70 | Unacceptable | A |
|  | Lanolin alcohol | 55 | 71 | Unacceptable | A |
| Block polymer | Polyoxyethylene polyoxypropylene block polymer A | 41 | 55 | Unacceptable | A |
|  | Polyoxyethylene polyoxypropylene block polymer B | 44 | 58 | Unacceptable | A |

TABLE 18-continued

| Substance | | Surface tension (dyne/cm) | Contact angle | Acceptability | Kind |
|---|---|---|---|---|---|
| | Polyoxyethylene polyoxypropylene block polymer C | 41 | 59 | Unacceptable | A |
| | Polyoxyethylene polyoxypropylene block polymer D | 41 | 52 | Unacceptable | A |

TABLE 19

| Substance | | Surface tension (dyne/cm) | Contact angle | Acceptability | Kind |
|---|---|---|---|---|---|
| Fatty acid and salt thereof | Valeric acid | 70 | 75 | Unacceptable | B |
| | Caproic acid | 64 | 74 | Unacceptable | B |
| | Enanthic acid | 55 | 77 | Unacceptable | B |
| | Caprylic acid | 50 | 68 | Unacceptable | B |
| Alkylbenzen sulfonate | Dodecylbenzene sulfonic acid sodium A | 36 | 20 | Acceptable | B |
| | Dodecylbenzene sulfonic acid sodium B | 31 | 25 | Acceptable | B |
| | Dodecylbenzene sulfonic acid | 29 | 18 | Acceptable | B |

TABLE 20

| Substance | | Surface tension (dyne/cm) | Contact angle | Acceptability | Kind |
|---|---|---|---|---|---|
| Alkylamine salt | Heptylamine | 31 | 55 | Unacceptable | C |
| | Dimethyloctylamine | 32 | 58 | Unacceptable | C |
| | Benzylamine | 33 | 55 | Unacceptable | C |

TABLE 21

| Substance | | Surface tension (dyne/cm) | Contact angle | Acceptability | Kind |
|---|---|---|---|---|---|
| Ethyleneoxide addition product | Perfluoro ethyleneoxide addition product A | 25 | 44 | Acceptable | E |
| | Perfluoro ethyleneoxide addition product B | 23 | 32 | Acceptable | E |
| | Perfluoro ethyleneoxide addition product C | 22 | 33 | Acceptable | E |
| | Perfluoro ethyleneoxide addition product D | 28 | 44 | Acceptable | E |
| Ester | Perfluoro alkyl ester A | 33 | 56 | Unacceptable | E |
| | Perfluoro alkyl ester B | 31 | 58 | Unacceptable | E |
| Amine oxide | Perfluoro alkyl amine oxide | 35 | 51 | Unacceptable | E |
| Alcohol | Fluoroalcohol | 24 | 66 | Unacceptable | E |

TABLE 22

| Substance | | Surface tension (dyne/cm) | Contact angle | Acceptability | Kind |
|---|---|---|---|---|---|
| Carboxylic acid and carbonate | Perfluoro alkyl carboxylic acid A | 30 | 42 | Acceptable | F |
| | Perfluoro alkyl carboxylic acid B | 26 | 44 | Acceptable | F |
| | Perfluoro alkyl carbonate A | 35 | 58 | Unacceptable | F |
| | Perfluoro alkyl carbonate B | 33 | 66 | Unacceptable | F |

TABLE 23

| Substance | | Surface tension (dyne/cm) | Contact angle | Acceptability | Kind |
|---|---|---|---|---|---|
| Quaternary ammonium salt | Perfluoro alkyl ammonium iodide A | 25 | 42 | Acceptable | G |
| | Perfluoro alkyl ammonium iodide B | 33 | 33 | Acceptable | G |
| | Perfluoro alkyl ammonium salt | 20 | 37 | Acceptable | G |

(3) Smoothness of silicon surface

It is said that with semiconductor devices, the smaller the subnanometer irregularities on the silicon wafer surface, i.e., the microroughness of the surface, the higher is the reliability of the device and the higher are the characteristics thereof. Accordingly, the roughness of silicon surfaces was measured by immersing a silicon wafer in the treating composition for 100 minutes and then determining the average surface microroughness (Ra) of the wafer surface under AFM. When the roughness was not greater than 0.3 nm (3 angstroms), the treating composition was evaluated as being satisfactory for the object of the invention.

The surfactants which were found satisfactory with respect to items (1) and (2) were checked for the present item (3). Tables 24 to 30 show the result.

TABLE 24

| Substance | | Surface roughness (Ra: nm) | Acceptability | Kind |
|---|---|---|---|---|
| Polyoxyethylene alkyl ether | Polyoxyethylene lauryl ether A | 0.21 | Acceptable | A |
| | Polyoxyethylene alkyl ether B | 0.22 | Acceptable | A |
| | Polyoxyethylene nonylphenyl ether A | 0.19 | Acceptable | A |
| | Polyoxyethylene nonylphenyl ether B | 0.15 | Acceptable | A |
| | Polyoxyethylene nonylphenyl ether C | 0.16 | Acceptable | A |
| | Polyoxyethylene alkylphenyl ether A | 0.28 | Acceptable | A |
| | Polyoxyethylene alkylphenyl ether B | 0.29 | Acceptable | A |
| | Polyoxyethylene octylphenyl ether | 0.22 | Acceptable | A |
| | Polyoxyethylene alkylallyl ether A | 0.15 | Acceptable | A |
| | Polyoxyethylene alkylallyl ether B | 0.16 | Acceptable | A |

TABLE 24-continued

| Substance | Surface roughness (Ra: nm) | Acceptability | Kind |
|---|---|---|---|
| Polyoxyethylene oleyl ether | 0.22 | Acceptable | A |
| Polyoxyethylene alkyl ether | 0.18 | Acceptable | A |
| Polyoxyethylene higher alcohol ether A | 0.25 | Acceptable | A |
| Polyoxyethylene higher alcohol ether B | 0.21 | Acceptable | A |

TABLE 25

| | Substance | Surface roughness (Ra: nm) | Acceptability | Kind |
|---|---|---|---|---|
| Nonionic surfactant | Polyoxyethylene derivative A | 0.33 | Unacceptable | A |
| | Polyoxyethylene derivative B | 0.56 | Unacceptable | A |
| | Polyoxyethylene derivative C | 0.77 | Unacceptable | A |
| | Polyoxyethylene derivative D | 0.33 | Unacceptable | A |
| Sorbitan fatty acid ester | Sorbitan monooleate A | 0.56 | Unacceptable | A |
| | Sorbitan monooleate B | 0.55 | Unacceptable | A |
| | Sorbitan sesquioleate | 0.33 | Unacceptable | A |
| | Sorbitan monolaurate | 0.38 | Unacceptable | A |
| | Sorbitan sesquioleate | 0.46 | Unacceptable | A |
| Polyoxyethylene sorbitan fatty acid ester | Polyoxyethylene sorbitan fatty acid ester (laureate) | 0.55 | Unacceptable | A |
| Fatty acid monoglyceride | Monoglycerol ester | 0.33 | Unacceptable | A |

TABLE 26

| | Substance | Surface roughness (Ra: nm) | Acceptability | Kind |
|---|---|---|---|---|
| Polyalkylene glycol | Polyoxyethylene glycol derivative A | 0.29 | Acceptable | A |
| | Polyoxyalkylene glycol derivative B | 0.25 | Acceptable | A |
| | Polyoxyalkylene glycol derivative C | 0.22 | Acceptable | A |
| | Polyoxyalkylene glycol derivative D | 0.22 | Acceptable | A |
| | Polyoxyalkylene glycol A | 0.21 | Acceptable | A |
| | Polyoxyalkylene glycol B | 0.25 | Acceptable | A |
| | Polyethylene glycol ester | 0.23 | Acceptable | A |
| Polyoxyethylene fatty acid ester | Polyethylene glycol fatty acid ester | 0.23 | Acceptable | A |
| | Polyoxyethylene oleic acid ester A | 0.28 | Acceptable | A |
| | Polyoxyethylene oleic acid ester B | 0.23 | Acceptable | A |
| | Polyoxyethylene oleic acid ester C | 0.33 | Unacceptable | A |
| | Polyoxyethylene oleic acid ester D | 0.35 | Unacceptable | A |

TABLE 26-continued

| | Substance | Surface roughness (Ra: nm) | Acceptability | Kind |
|---|---|---|---|---|
| | Polyoxyethylene oleic acid ester E | 0.36 | Unacceptable | A |
| | Polyoxyethylene fatty acid ester | 0.36 | Unacceptable | A |

TABLE 27

| | Substance | Surface roughness (Ra: nm) | Acceptability | Kind |
|---|---|---|---|---|
| Alkylbenzen sulfonate | Dodecylbenzene sulfonic acid sodium A | 0.32 | Unacceptable | B |
| | Dodecylbenzene sulfonic acid sodium B | 0.31 | Unacceptable | B |
| | Dodecylbenzene sulfonic acid | 0.35 | Unacceptable | B |

TABLE 28

| | Substance | Surface roughness (Ra: nm) | Acceptability | Kind |
|---|---|---|---|---|
| Ethyleneoxide addition product | Perfluoro ethyleneoxide addition product A | 0.32 | Unacceptable | E |
| | Perfluoro ethyleneoxide addition product B | 0.39 | Unacceptable | E |
| | Perfluoro ethyleneoxide addition product C | 0.39 | Unacceptable | E |
| | Perfluoro ethyleneoxide addition product D | 0.33 | Unacceptable | E |

TABLE 29

| | Substance | Surface roughness (Ra: nm) | Acceptability | Kind |
|---|---|---|---|---|
| Carboxylic acid and carbonate | Perfluoro alkyl carboxylic acid A | 0.28 | Acceptable | F |
| | Perfluoro alkyl carboxylic acid B | 0.25 | Acceptable | F |

TABLE 30

| | Substance | Surface roughness (Ra: nm) | Acceptability | Kind |
|---|---|---|---|---|
| Quaternary ammonium salt | Perfluoro alkyl ammonium iodide A | 0.39 | Unacceptable | G |
| | Perfluoro alkyl ammonium iodide B | 0.36 | Unacceptable | G |
| | Perfluoro alkyl ammonium salt | 0.55 | Unacceptable | G |

The symbols A to H in the above tables each have the same meaning as previously stated.

(4) Diminished adhesion of particles to silicon surface

A previously described in connection with the item (2), the particles present on the wafer exert a fatal effect on the semiconductor device to be fabricated. A wafer inspection system was used to count the number of particles adhering to the surface of silicon.

Wafers were treated with hydrofluoric acid without surfactant or hydrofluoric acid with a surfactant, and then checked for the number of particles adhering to the wafer surface for comparison. Since the treatment with hydrofluoric acid is the final step of etching and cleaning processes, the wafer treated with the treating composition is thereafter treated only by washing with ultrapure water. Accordingly, the reduction of the number of particles adhering to the wafer surface is a very important item. The number of adhering particles which is satisfactory for the object of the invention is not greater than 100 particles of 0.3 to 0.5 μm on 5-inch bare silicon wafer.

Figure 2:
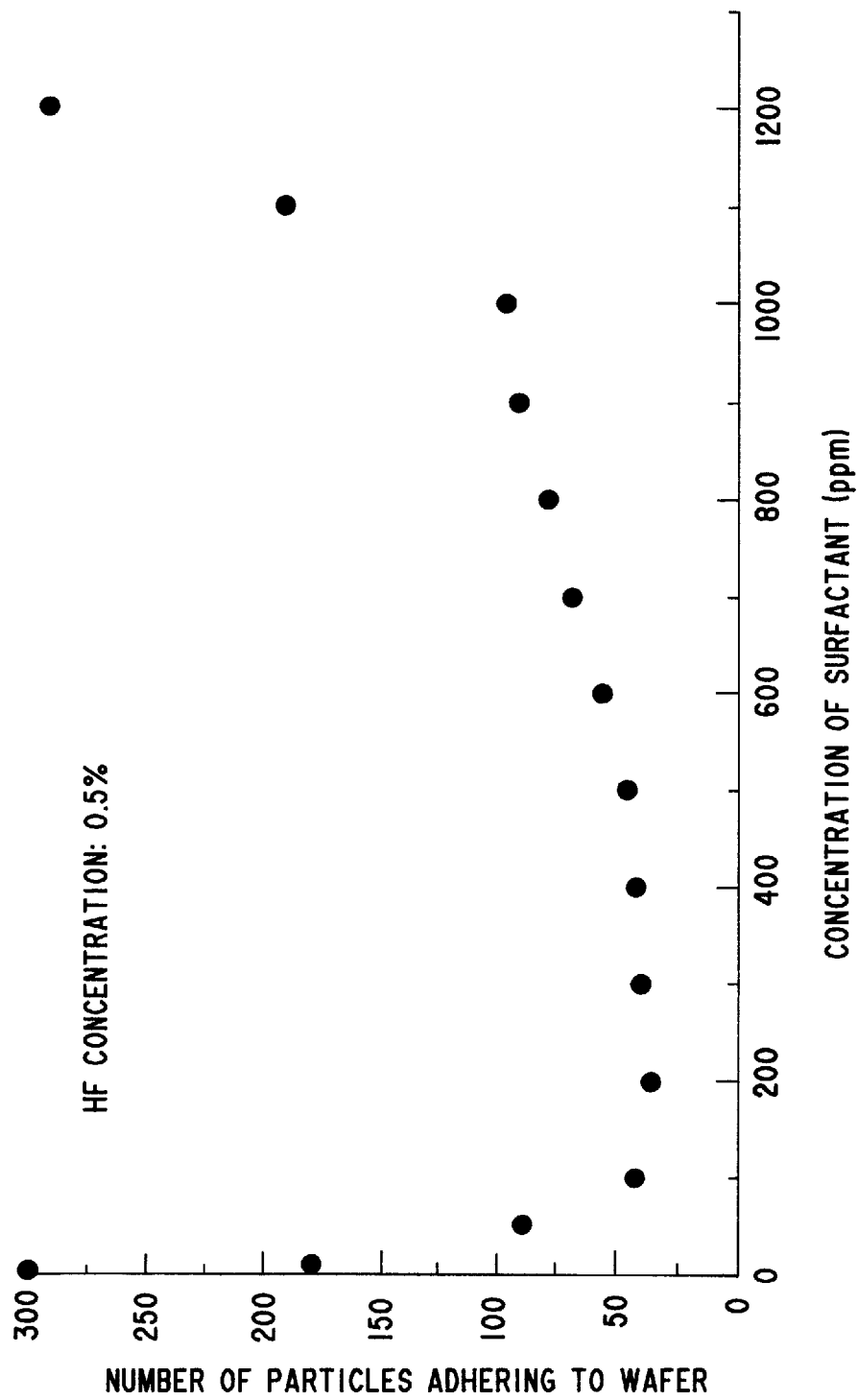
FIG. 2 is a diagram showing the relationship between the concentration of surfactants and the number of adhering particles.

FIG. 2 shows the relationship between the concentration of surfactant and the number of adhering particles. FIG. 1, showing the relationship between the concentration of a surfactants and the number of particles, indicates that the surfactant concentration is effective even if low, whereas it is seen that an increase in the concentration (beyond 1000 ppm) markedly increases the number of particles in the treating composition and also in the number of particles adhering to the silicon surface. Thus, it is desired to add the surfactant in an amount of up to 1000 ppm.

Accordingly, the surfactants found satisfactory with respect to the items (1) to (3) were checked for the present item (4). Tables 31 to 33 show the result.

TABLE 31

| | Substance | Number of adhering particles (per 5 in.) | Acceptability | Kind |
|---|---|---|---|---|
| Polyoxyethylene alkyl ether | Polyoxyethylene lauryl ether A | 36 | Acceptable | A |
| | Polyoxyethylene alkyl ether B | 55 | Acceptable | A |
| | Polyoxyethylene nonylphenyl ether A | 22 | Acceptable | A |
| | Polyoxyethylene nonylphenyl ether B | 88 | Acceptable | A |
| | Polyoxyethylene nonylphenyl ether C | 56 | Acceptable | A |
| | Polyoxyethylene alkyl phenyl ether A | 77 | Acceptable | A |
| | Polyoxyethylene alkyl phenyl ether B | 66 | Acceptable | A |
| | Polyoxyethylene octyl phenyl ether | 35 | Acceptable | A |
| | Polyoxyethylene alkyl-allyl ether A | 46 | Acceptable | A |
| | Polyoxyethylene alkyl-allyl ether B | 55 | Acceptable | A |
| | Polyoxyethylene oleyl ether | 48 | Acceptable | A |
| | Polyoxyethylene alkyl ether | 44 | Acceptable | A |
| | Polyoxyethylene higher alcohol ether A | 78 | Acceptable | A |
| | Polyoxyethylene higher alcohol ether B | 177 | Unacceptable | A |

TABLE 32

| | Substance | Number of adhering particles (per 5 in.) | Acceptability | Kind |
|---|---|---|---|---|
| Polyalkylene glycol | Polyoxyalkylene glycol derivative A | 55 | Acceptable | A |
| | Polyoxyalkylene glycol derivative B | 33 | Acceptable | A |
| | Polyoxyalkylene glycol derivative C | 44 | Acceptable | A |
| | Polyoxyalkylene glycol derivative D | 45 | Acceptable | A |
| | Polyoxyalkylene glycol A | 44 | Acceptable | A |
| | Polyoxyalkylene glycol B | 44 | Acceptable | A |
| | Polyethylene glycol ester | 56 | Acceptable | A |
| Polyoxyethylene fatty acid ester | Polyethylene glycol fatty acid ester | 55 | Acceptable | A |
| | Polyoxyethylene oleic acid ester A | 55 | Acceptable | A |
| | Polyoxyethylene oleic acid ester B | 155 | Unacceptable | A |

TABLE 33

| | Substance | Number of adhering particles (per 5 in.) | Acceptability | Kind |
|---|---|---|---|---|
| Carboxylic acid and carbonate | Perfluoro alkyl carboxylic acid A | 44 | Acceptable | F |
| | Perfluoro alkyl carboxylic acid B | 232 | Unacceptable | F |

The symbols A to H in these tables each have the same meaning as previously stated.

(5) Stability of treating composition

Treating compositions fulfilling the foregoing four requirements were prepared, then allowed to stand for 6 months, thereafter tested for the four requirements and thereby checked for changes.

Treating compositions containing one of surfactants which were satisfactory in respect of the term (4) were tested for the number of particles therein, surface tension, contact angle, the number of particles adhering to a wafer and surface roughness of the wafer after standing to exhibit the same result as immediately after preparation.

(6) High purity of treating composition

Treating compositions having a surfactant incorporated therein were analyzed to determine the components and checked for increases in the amounts of alkali metals, alkaline earth metals or heavy metals that would produce an adverse effect on semiconductor fabrication processes to evaluate the purity of the composition.

The surfactants satisfactory with respect to the term (5) were checked by analyzing the composition incorporating the surfactant upon lapse of 6 months after preparation to determine impurities. Consequently none of the surfactants increased the amounts of alkali metals, alkaline earth metals or heavy metals that would adversely affect semiconductor fabrication processes.

The surfactants satisfying all the foregoing requirements (1) to (6) were checked for the last requirement (7) of rendering hydrofluoric acid usable for the main purpose contemplated, i.e., for etching a silicon oxide film, or removing an oxide film as formed over the entire surface of a silicon wafer or in etched grooves therein when the wafer is cleaned with sulfuric acid-hydrogen peroxide aqueous solution, hydrochloric acid-hydrogen peroxide aqueous solution or ammonia-hydrogen peroxide aqueous solution or when the wafer is further washed with ultrapure water.

(7) Silicon surface cleaning effect or oxide film etching effect.

The first purpose of the present treating composition is to remove a natural oxide film from silicon surfaces. Growth of the natural oxide film occurs not only in the atmosphere but also when silicon wafers are rinsed with ultrapure water or when sulfuric acid-hydrogen peroxide aqueous solution, hydrochloric acid-hydrogen peroxide aqueous solution or ammonia water-hydrogen peroxide aqueous solution is used for cleaning in semiconductor fabrication processes.

The oxide film thus occurring needs to be removed with the present treating composition, whereas some surfactants are firmly adsorbed by the surface off silicon oxide film and hamper removal of the film. Whether the natural oxide film on a silicon surface has been removed can be checked by immersing a silicon oxide film grown by the wet method in the treating composition for 1 minute, rinsing the substrate with ultrapure water for 1 minute and measuring the contact angle of ultrapure water as applied dropwise to the substrate, that is, by checking whether the contact angle of ultrapure water on the immersed and rinsed substrate is 72 degree which is the contact angle of water on the silicon substrate. Tables 34 to 36 show the result.

TABLE 34

| | | Contact angle (degree) | | | |
| | | Before | After | | |
| | Substance | immersion | immersion | Acceptability | Kind |
|---|---|---|---|---|---|
| None | | 12 | 72 | | |
| Polyoxyethylene alkyl ether | Polyoxyethylene lauryl ether | 12 | 72 | Acceptable | A |
| | Polyoxyethylene alkyl ether | 12 | 72 | Acceptable | A |
| | Polyoxyethylene nonylphenyl ether A | 12 | 72 | Acceptable | A |
| | Polyoxyethylene nonylphenyl ether B | 12 | 72 | Acceptable | A |
| | Polyoxyethylene nonylphenyl ether C | 12 | 72 | Acceptable | A |
| | Polyoxyethylene alkylphenyl ether A | 12 | 72 | Acceptable | A |
| | Polyoxyethylene alkylphenyl ether B | 12 | 72 | Acceptable | A |
| | Polyoxyethylene octylphenyl ether | 12 | 72 | Acceptable | A |
| | Polyoxyethylene alkylallyl ether A | 12 | 72 | Acceptable | A |
| | Polyoxyethylene alkylallyl ether B | 12 | 72 | Acceptable | A |
| | Polyoxyethylene oleic ether | 12 | 72 | Acceptable | A |
| | Polyoxyalkylene alkyl ether | 12 | 72 | Acceptable | A |
| | Polyoxyethylene higher alcohol ether | 12 | 72 | Acceptable | A |

TABLE 35

| | | Contact angle (degree) | | | |
| | | Before | After | | |
| | Substance | immersion | immersion | Acceptability | Kind |
|---|---|---|---|---|---|
| Polyalkylene glycol | Polyoxyethylene glycol ether | 12 | 72 | Acceptable | A |
| | Polyoxyalkylene glycol derivative A | 12 | 72 | Acceptable | A |
| | Polyoxyalkylene glycol derivative B | 12 | 72 | Acceptable | A |
| | Polyoxyalkylene glycol derivative C | 12 | 72 | Acceptable | A |
| | Polyoxyalkylene glycol derivative D | 12 | 72 | Acceptable | A |
| | Polyoxyalkylene glycol A | 12 | 72 | Acceptable | A |
| | Polyoxyalkylene glycol B | 12 | 72 | Acceptable | A |
| Polyoxyethylene fatty acid ester | Polyoxyethylene oleic acid ester | 12 | 72 | Acceptable | A |
| | Polyethylene glycol fatty acid ester | 12 | 56 | Unacceptable | A |

TABLE 36

| Substance | | Contact angle (degree) | | Acceptability | Kind |
| --- | --- | --- | --- | --- | --- |
| | | Before immersion | After immersion | | |
| None | | 12 | 72 | | |
| Carboxylic acid | Perfluoro alkyl carboxylic acid | 12 | 85 | Unacceptable | F |

The symbols A to H each have the same meaning as previously mentioned.

The ultrapure water applied dropwise to the silicon oxide film formed by the wet method has a contact angle of 12 degree, and spreads thin over the oxide film. However, ultrapure water on the surface of silicon from which the oxide film has been removed with the treating composition forms a round drop and is 72 degree in contact angle. This indicates that the silicon oxide film has been removed with the treating composition.

However, some surfactants cover the silicon oxide film and hamper removal of the oxide film with hydrofluoric acid. Accordingly, even if the silicon substrate is immersed in the treating composition for one minute, it is likely that ultrapure water will not exhibit a contact angle of about 72 degree. The surfactant becomes adsorbed by the surface of the oxide film, not only hampering etching of the oxide film but also forming a hydrophobic surface characteristic of fluorine-containing surfactants, such that ultrapure water exhibits a contact angle of at least 85 degree on the surface. Hydrocarbon surfactants are highly hydrophilic, become adsorbed by the natural oxide film on the wafer surface and permit the oxide film to remain partly unremoved with an HF solution, so that water exhibits a diminished contact angle of about 50 degree on the surface. Water on a natural oxide film grown by the dry method shows a large contact angle (36 degree), so that is is difficult to check whether the oxide film has been removed. For this reason, the film grown by the wet method was used.

The investigations conducted to find out surfactants fulfilling all the foregoing seven requirements revealed that some kinds of nonionic surfactants and mixtures thereof only were found suitable for the contemplated object. The present invention has been accomplished based on such various novel findings. When checked for characteristics, these surfactants suitable for the object were found to be in the range of 7 to 17 in HLB.

The HLB value of a surfactants is the hydrophile-lipophile balance of the chemical structure thereof. As is well known, it is a numerical value indicating the balance between the hydrophilic properties of the surfactant and the lipophilic properties thereof. However, the fact that the contact angle on the silicon surface is dependent on the HLB value is not known up to date but has been found for the first time by the present invention.

The micro processing surface treating composition of the present invention comprises hydrofluoric acid and at least one specific nonionic surfactant fulfilling the foregoing requirements and admixed with the acid, the surfactant having an HLB value in the range of 7 to 17.

The term "hydrofluoric acid" refers to an aqueous solution of hydrofluoric acid containing 0.01 to 55 wt. % of hydrogen fluoride.

Nonionic surfactants have a basic structure of polyoxyalkyl, comprise a group of chemical structures of the ether type, ester type, glycol type or the like, greatly vary in detailed structure, are greatly different in the structure of the molecule, i.e., in molecular weight, number of carbon atoms, substituents, etc., and are nevertheless identified by common chemical names usually. Accordingly, the characteristics and behavior exhibited by a particular surfactant in the treating composition can not be characterized by a chemical structural formula. However, since characterization of its effect is very important, attempts to characterize the acceptable surfactant were made from every angle.

Consequently, we have discovered very apparent chemical structural regularity, i.e., a relationship between the contact angle on the silicon surface of the treating composition incorporating a surfactant and the HLB value of the surfactant.

Surfactants having a series of HLB values were checked for the contact angle on the surface of silicon. Table 37 shows the result.

The result has revealed that there is a region of minimized contact angles over a range of HLB values. More specifically, the contact angle was not greater than 50 degree when the group of compounds mentioned are in the range of 7 to 17 in HLB value. When the HLB value is less than 7 or more than 18, the contact angle exceeds 50 degree, and the silicon surface becomes unwettable.

TABLE 37

| HLB | Contact angle on Si surface | | | |
| --- | --- | --- | --- | --- |
| | 0.01% HF | 0.5% HF | 5% HF | 50% HF |
| 3.7 | 84 | 74 | 69 | 68 |
| 6.0 | 67 | 65 | 60 | 53 |
| 6.7 | 61 | 53 | 51 | 51 |
| 7.0* | 50 | 49 | 46 | 42 |
| 8.0* | 43 | 39 | 37 | 34 |
| 9.0 | 35 | 32 | 28 | 25 |
| 10.0* | 24 | 22 | 18 | 16 |
| 10.8 | 19 | 15 | 14 | 12 |
| 13.1 | 23 | 21 | 20 | 19 |
| 13.7 | 26 | 24 | 24 | 21 |
| 14.0 | 29 | 25 | 24 | 21 |
| 14.0* | 30 | 25 | 24 | 22 |
| 15.1 | 38 | 33 | 33 | 30 |
| 16.0 | 41 | 40 | 36 | 32 |
| 17.0 | 49 | 49 | 48 | 46 |
| 18.0 | 65 | 62 | 60 | 60 |

Table 37 shows the relationship between the HLB value and the contact angle. The mark* in the table indicates a mixture.

The HLB value has the additive property, that is, when $W_A$ g of a surfactant with $HLB_A$ is mixed with $W_B$ g of a surfactant with $HLB_B$, the $HLB_{AB}$ of the mixture is expressed by the equation 1

$$HLB_{AB} = (HLB_A \times W_A + HLB_B \times W_B)/(W_A + W_B)$$

as is known. The dependence of the contact angle on HLB was substantiated also in the case of mixtures; we have found that there is a region of minimized contact angles.

Table 38 shows the result of an experiment for determining the relationship between the HLB value and the number of particles. The result indicates that the HLB value, when at least 7, results in a reduced number of particles, and that the number of particles in the treating composition can not be decrease despite circulating filtration if the composition has incorporated therein a surfactant which is less than 7 in HLB value.

TABLE 38

| HLB | Number of particles >0.5 μm | | | |
|---|---|---|---|---|
| | 0.01% HF | 0.5% HF | 5% HF | 50% HF |
| 3.7 | >10 | >10 | >10 | >10 |
| 6.0 | >10 | >10 | >10 | >10 |
| 6.7 | >10 | >10 | >10 | >10 |
| 7.0* | 9 | 6 | 6 | 4 |
| 8.0* | 8 | 7 | 6 | 6 |
| 9.0 | 9 | 9 | 8 | 7 |
| 10.0* | 3 | 7 | 5 | 5 |
| 10.8 | 4 | 7 | 6 | 6 |
| 13.1 | 2 | 6 | 5 | 6 |
| 13.7 | 5 | 3 | 5 | 2 |
| 14.0 | 4 | 3 | 3 | 3 |
| 14.0* | 4 | 4 | 7 | 3 |
| 15.1 | 4 | 4 | 6 | 3 |
| 16.0 | 3 | 3 | 4 | 2 |
| 17.0 | 4 | 1 | 2 | 1 |
| 18.0 | 2 | 2 | 3 | 2 |

Table 38 shows the number of particles as determined after circulating filtration. The mark* indicates a mixture.

While the mechanism through which the presence of surfactant permits very fine particles to be filtered off appears to be associated with formation of micelles of surfactant particles, we have found for the first time that the mechanism is dependent also on the HLB value of the surfactant.

In view of the all the foregoing novel findings, the range of HLB values of surfactants suitable or use in the treating composition is to be determined. More specifically, at least one nonionic surfactant to be mixed with hydrofluoric acid should be in the range of 7 to 17 preferably 10 to 15 in HLB value.

Examples of nonionic surfactants for use in the present invention are glycol esters, condensates of higher alcohols, condensates of higher fatty acids and condensates of alkyl phenols. More specific examples of preferred surfactants are as follows.

Polyoxyethylene higher alcohol ethers (10.5, 12.1, and 13.3 in HLB value)

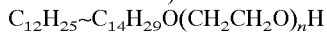

$C_{12}H_{25}\sim C_{14}H_{29}O(CH_2CH_2O)_nH$

Polyoxyethylene oleic acid esters (9, 12, 14 and 16 in HLB value)

$C_{17}H_{33}COO(CH_2CH_2O)_nH$

Polyoxyethylene lauryl ethers (8, 9.4, 9.7, 10, 10.5, 12.1, 13.8, 13.9, 14, 15.3, 16, 16.3, 17, 17.3, 19 and 20 in HLB value)

$C_{12}H_{25}O(CH_2CH_2O)_nH$

Polyoxyethylene nonyl phenyl ethers (7.8, 9.2, 10.8, 12.2, 12.4, 13.7, 14.5, 15.1, 15.5, 17, 17.5, 18.2, and 18.9 in HLB value)

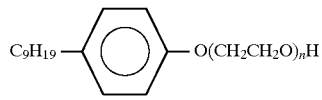

Equation 2

Polyoxyethylene octyl phenyl ethers (9, 11, 12, 13.1, 14, 15, 18, 19 and 20 in HLB value)

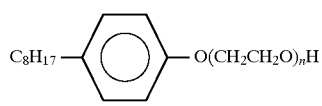

Equation 3

Polyoxyethylene alkyl allyl ethers (8, 8.8, 10.0, 12, 13, 13.6, 14, 15, 16, 16.2 and 17 in HLB value)
$R-CH_2CHCHO(CH_2CH_2O)_nH$ wherein R is alkyl.

These surfactants are used singly, or at least two of them are used in admixture. The surfactant is used as it is, i.e., in the form of a solid, or in the form of a liquid. The amount of surfactant to be used is 10 to 1000 ppm based on the whole composition.

The hydrofluoric acid to be present in the treating composition of the invention is generally dilute hydrofluoric acid having a concentration, for example, of 5 wt. % or 0.5 wt. %, so that the surfactant may be added in an amount of 10 to 1000 ppm to hydrofluoric acid of the desired concentration. In the case where the surfactant is to be added at a concentration, or example, of 250 ppm, the surfactant may be added to 50 wt. % hydrofluoric acid to a concentration of 2500 ppm or 25000 ppm, which is then diluted to 5 wt. % or 0.5 wt. % hydrofluoric acid. Even in this case, the resulting composition exhibits the same activity as the composition prepared by adding 250 ppm of the present surfactant. In fact, the natural oxide film on the surface of silicon and the natural oxide film in grooves formed by patterning were found removable with such a composition. When the present treating composition was checked for metal impurities which were detrimental to surface treatment for micro processing, no increase was found in the amount of these impurities, with the result that the composition retained the high purity of the treating solution.

When the treating composition of the invention was used for etching silicon surfaces, the number of particles adhering to the etched surface was small.

Further when silicon wafers were immersed in the treating composition of the invention for 100 minutes, the composition achieved a remarkable improvement in the roughness of the etched surface as compared with hydrofluoric acid free from any surfactant of the invention.

The treating composition of the invention was stored for 3 months and then checked for surface tension, contact angle and the number of particles to find that the composition prepared remained unchanged. Further the composition was subjected to circulating filtration but was found still satisfactory with respect to the foregoing seven requirements. These results indicate that the treating composition has long-term stability.

The micro processing surface treating composition of the invention exhibits an improved wetting property on the surface of silicon, permits smaller etching and more uniform etching for the fabrication of devices of higher integration density and further cleans the surface of silicon. Even when stored for a long period of time, the composition remains free of any changes in properties and retains its properties even when filtered. These features enable the composition to exhibit a high degree of uniformity in micro processing. Especially because the treating composition is reduced in the number of particles therein and further because the surface to be etched is effectively wettable with the composition, the surface can be etched with a reduced likelihood of particles adhering thereto and further given a smooth finish.

EXAMPLES

The present invention will be described in greater detail with reference to the following examples.

Example 1

A surfactant was added in an amount of 200 ppm to 0.5, 5.0 or 50 wt. % hydrofluoric acid, and the resulting composition was checked for surface tension, contact angle on silicon and number of particles (at least 0.5 μm in size). Further a 5-inch silicon wafer was immersed in a solution prepared by adding 200 ppm of a surfactant to 0.5, 5.0 or 50 wt. % hydrofluoric acid, and thereafter checked for the number of particles (0.3 μm to 1.0 μm) adhering to the wafer surface by a wafer inspection system. The roughness of the wafer surface was measured under AFM after the wafer was held immersed in the composition for 100 minutes. Tables 39 to 44 show the result.

TABLE 39

| Surface active agent (Addition of 200 ppm) | HLB | Surface tension (dyn/cm) | Contact angle (degree) | Number of particles (per ml) | Number of adhering particles (0.3 μm~1.0 μm) | Surface roughness Ra (nm) |
|---|---|---|---|---|---|---|
| POE alkylallyl ether | 16.0 | 37 | 40 | 3 | 47 | 0.28 |
| POE lauryl ether | 12.1 | 38 | 10 | 2 | 38 | 0.22 |
| POE lauryl ether | 15.3 | 39 | 46 | 1 | 66 | 0.23 |
| POE lauryl ether | 16.3 | 39 | 38 | 2 | 59 | 0.17 |
| POE lauryl ether | 17.0 | 45 | 50 | 1 | 67 | 0.19 |
| POE oleyl ether | 13.6 | 33 | 15 | 5 | 41 | 0.15 |
| POE oleyl ether | 16.2 | 40 | 41 | 3 | 48 | 0.17 |
| POE nonylphenyl ether | 10.8 | 38 | 15 | 7 | 58 | 0.22 |
| POE nonylphenyl ether + POE nonylphenyl ether | 12.0 | 32 | 11 | 5 | 45 | 0.11 |
| POE nonylphenyl ether | 13.7 | 30 | 24 | 3 | 31 | 0.14 |
| POE nonylphenyl ether | 15.1 | 36 | 33 | 4 | 39 | 0.27 |
| POE nonylphenyl ether | 15.5 | 36 | 35 | 3 | 41 | 0.23 |
| POE nonylphenyl ether | 14.5 | 39 | 26 | 2 | 57 | 0.29 |

TABLE 40

| Surface active agent (Addition of 200 ppm) | HLB | Surface tension (dyn/cm) | Contact angle (degree) | Number of particles (per ml) | Number of adhering particles (0.3 μm~1.0 μm) | Surface roughness Ra (nm) |
|---|---|---|---|---|---|---|
| POE oleic acid ester | 9.0 | 31 | 32 | 9 | 81 | 0.24 |
| POE oleic acid ester | 14.0 | 38 | 25 | 3 | 45 | 0.24 |
| POE nonylphenyl ether | 14.5 | 41 | 29 | 2 | 41 | 0.19 |
| POE higher alcohol ether | 10.5 | 29 | 20 | 9 | 67 | 0.23 |
| POE higher alcohol ether | 13.3 | 32 | 14 | 3 | 48 | 0.16 |
| POE octylphenyl ether | 19.1 | 28 | 21 | 6 | 58 | 0.24 |
| POE oleyl ether + POE nonylphenyl ether | 10.0 | 27 | 22 | 7 | 75 | 0.27 |
| POE oleyl ether + POE nonylphenyl ether | 7.0 | 44 | 49 | 6 | 44 | 0.20 |
| POE oleyl ether + POE nonylphenyl ether | 14.0 | 38 | 25 | 4 | 44 | 0.23 |
| POE oleic acid ester + POE nonylphenyl ether | 8.0 | 33 | 39 | 7 | 39 | 0.28 |
| POE oleic acid ester + POE nonylphenyl ether | 12.0 | 33 | 13 | 4 | 53 | 0.23 |
| POE oleic acid ester + POE nonylphenyl ether | 14.0 | 35 | 29 | 4 | 35 | 0.20 |
| Polyethylene glycol derivative | 11.6 | 35 | 12 | 8 | 56 | 0.26 |

TABLE 41

| Surface active agent (Addition of 200 ppm) | HLB | Surface tension (dyn/cm) | Contact angle (degree) | Number of particles (per ml) | Number of adhering particles (0.3 μm~1.0 μm) | Surface roughness Ra (nm) |
|---|---|---|---|---|---|---|
| POE alkylallyl ether | 16.0 | 35 | 36 | 4 | 57 | 0.25 |
| POE rauryl ether | 12.1 | 36 | 11 | 2 | 68 | 0.26 |
| POE rauryl ether | 15.3 | 37 | 45 | 5 | 45 | 0.21 |
| POE rauryl ether | 16.3 | 37 | 35 | 2 | 47 | 0.14 |
| POE rauryl ether | 17.0 | 40 | 48 | 2 | 56 | 0.17 |
| POE oleyl ether | 13.6 | 32 | 16 | 3 | 47 | 0.16 |
| POE oleyl ether | 16.2 | 39 | 44 | 3 | 55 | 0.19 |
| POE nonylphenyl ether | 10.8 | 36 | 14 | 6 | 39 | 0.25 |
| POE nonylphenyl ether + POE nonylphenyl ether | 12.0 | 31 | 12 | 5 | 29 | 0.10 |
| POE nonylphenyl ether | 13.7 | 30 | 24 | 5 | 22 | 0.14 |
| POE nonylphenyl ether | 15.1 | 34 | 33 | 6 | 30 | 0.26 |
| POE nonylphenyl ether | 15.5 | 34 | 35 | 2 | 26 | 0.26 |
| POE nonylphenyl ether | 14.5 | 37 | 29 | 2 | 44 | 0.26 |

TABLE 42

| Surface active agent (Addition of 200 ppm) | HLB | Surface tension (dyn/cm) | Contact angle (degree) | Number of particles (per ml) | Number of adhering particles (0.3 μm~1.0 μm) | Surface roughness Ra (nm) |
|---|---|---|---|---|---|---|
| POE oleic acid ester | 9.0 | 30 | 29 | 8 | 61 | 0.23 |
| POE oleic acid ester | 14.0 | 37 | 24 | 3 | 75 | 0.25 |
| POE nonylphenyl ether | 14.5 | 40 | 28 | 2 | 61 | 0.19 |
| POE higher alcohol ether | 10.5 | 27 | 24 | 5 | 66 | 0.29 |
| POE higher alcohol ether | 13.3 | 30 | 17 | 6 | 32 | 0.14 |
| POE octylphenyl ether | 13.1 | 27 | 20 | 5 | 68 | 0.25 |
| POE oleyl ether + POE nonyl-phenyl ether | 10.0 | 25 | 18 | 5 | 39 | 0.21 |
| POE oleyl ether + POE nonyl-phenyl ether | 7.0 | 41 | 46 | 6 | 55 | 0.22 |
| POE oleyl ether + POE nonyl-phenyl ether | 14.0 | 38 | 24 | 7 | 43 | 0.22 |
| POE oleic acid ester + POE nonylphenyl ether | 8.0 | 33 | 37 | 6 | 50 | 0.22 |
| POE oleic acid ester + POE nonylphenyl ether | 12.0 | 31 | 18 | 4 | 45 | 0.26 |
| POE oleic acid ester + POE nonylphenyl ether | 14.0 | 34 | 29 | 5 | 45 | 0.21 |
| Polyethylene glycol derivative | 11.6 | 34 | 12 | 7 | 45 | 0.25 |

TABLE 43

| Surface active agent (Addition of 200 ppm) | HLB | Surface tension (dyn/cm) | Contact angle (degree) | Number of particles (per ml) | Number of adhering particles (0.3 μm~1.0 μm) | Surface roughness Ra (nm) |
|---|---|---|---|---|---|---|
| POE alkylallyl ether | 16.0 | 37 | 32 | 4 | 49 | 0.22 |
| POE rauryl ether | 12.1 | 39 | 13 | 1 | 58 | 0.21 |
| POE rauryl ether | 15.3 | 37 | 44 | 1 | 25 | 0.25 |
| POE rauryl ether | 16.3 | 38 | 33 | 2 | 56 | 0.19 |
| POE rauryl ether | 17.0 | 42 | 46 | 1 | 55 | 0.12 |
| POE oleyl ether | 13.5 | 33 | 15 | 4 | 51 | 0.12 |
| POE oleyl ether | 16.2 | 42 | 40 | 2 | 40 | 0.18 |
| POE nonylphenyl ether | 10.8 | 39 | 12 | 6 | 68 | 0.26 |
| POE nonylphenyl ether + POE nonylphenyl ether | 12.0 | 34 | 13 | 4 | 30 | 0.17 |
| POE nonylphenyl ether | 13.7 | 36 | 21 | 2 | 34 | 0.18 |
| POE nonylphenyl ether | 15.1 | 37 | 30 | 3 | 34 | 0.26 |
| POE nonylphenyl ether | 15.5 | 37 | 31 | 3 | 40 | 0.24 |
| POE nonylphenyl ether | 14.5 | 39 | 27 | 2 | 57 | 0.29 |

TABLE 44

| Surface active agent (Addition of 200 ppm) | HLB | Surface tension (dyn/cm) | Contact angle (degree) | Number of particles (per ml) | Number of adhering particles (0.3 μm~1.0 μm) | Surface roughness Ra (nm) |
|---|---|---|---|---|---|---|
| POE oleic acid ester | 9.0 | 33 | 25 | 7 | 89 | 0.25 |
| POE oleic acid ester | 14.0 | 39 | 21 | 3 | 48 | 0.24 |
| POE nonylphenyl ether | 14.5 | 43 | 26 | 2 | 48 | 0.21 |
| POE higher alcohol ether | 10.5 | 32 | 22 | 7 | 47 | 0.22 |
| POE higher alcohol ether | 13.3 | 35 | 16 | 3 | 68 | 0.17 |
| POE octylphenyl ether | 13.1 | 32 | 19 | 6 | 58 | 0.29 |
| POE oleyl ether + POE nonyl-phenyl ether | 10.0 | 37 | 16 | 5 | 35 | 0.28 |
| POE oleyl ether + POE nonyl-phenyl ether | 7.0 | 37 | 42 | 4 | 49 | 0.28 |
| POE oleyl ether + POE nonyl-phenyl ether | 14.0 | 39 | 22 | 3 | 23 | 0.26 |
| POE oleic acid ester + POE nonylphenyl ether | 8.0 | 37 | 34 | 6 | 55 | 0.21 |
| POE oleic acid ester + POE nonylphenyl ether | 12.0 | 36 | 16 | 4 | 43 | 0.21 |
| POE oleic acid ester + POE nonylphenyl ether | 14.0 | 38 | 20 | 3 | 39 | 0.25 |
| Polyethylene glycol derivative | 11.6 | 32 | 12 | 7 | 38 | 0.22 |

Tables 39 and 40 show the characteristics measurements obtained with the treating composition comprising 0.5 wt. % HF, Tables 41 and 42 show those obtained at an HF concentration of 5.0 wt. %, and Tables 43 and 44 show those obtained at an HF concentration of 50.0 wt. %. POE in the tables stands for polyoxyethylene.

Example 2

A surfactant was added in an amount of 2000 ppm to 50 wt. % hydrofluoric acid to obtain a treating composition, which was then diluted to 5.0 wt. %. Further a treating composition prepared with use of 20000 ppm of a surfactant was diluted to 0.5 wt. %. Tables 45 to 48 show the characteristics of the resulting compositions.

TABLE 45

| Surface active agent (Addition of 200 ppm) | HLB | Surface tension (dyn/cm) | Contact angle (degree) | Number of particles (per ml) |
|---|---|---|---|---|
| POE alkylallyl ether | 16.0 | 33 | 33 | 4 |
| POE rauryl ether | 12.1 | 35 | 12 | 2 |
| POE rauryl ether | 15.3 | 35 | 43 | 5 |
| POE rauryl ether | 16.3 | 34 | 42 | 2 |
| POE rauryl ether | 17.0 | 37 | 48 | 2 |
| POE oleyl ether | 13.6 | 31 | 16 | 3 |
| POE oleyl ether | 16.2 | 38 | 42 | 3 |
| POE nonylphenyl ether | 10.8 | 36 | 20 | 5 |
| POE nonylphenyl ether + POE nonylphenyl ether | 12.0 | 30 | 14 | 2 |
| POE nonylphenyl ether | 13.7 | 30 | 25 | 5 |
| POE nonylphenyl ether | 15.1 | 33 | 32 | 4 |
| POE nonylphenyl ether | 15.5 | 33 | 37 | 3 |
| POE nonylphenyl ether | 14.5 | 37 | 30 | 5 |

TABLE 46

| Surface active agent (Addition of 200 ppm) | HLB | Surface tension (dyn/cm) | Contact angle (degree) | Number of particles (per ml) |
|---|---|---|---|---|
| POE oleic acid ester | 9.0 | 31 | 24 | 9 |
| POE oleic acid ester | 14.0 | 35 | 20 | 7 |
| POE nonylphenyl ether | 14.5 | 40 | 30 | 2 |
| POE higher alcohol ether | 10.5 | 27 | 27 | 5 |
| POE higher alcohol ether | 13.3 | 29 | 16 | 3 |
| POE octylphenyl ether | 13.1 | 28 | 25 | 2 |
| POE oleyl ether + POE nonylphenyl ether | 10.0 | 26 | 24 | 6 |
| POE oleyl ether + POE nonylphenyl ether | 7.0 | 42 | 44 | 4 |
| POE oleyl ether + POE nonylphenyl ether | 14.0 | 37 | 22 | 6 |
| POE oleic acid ester + POE nonylphenyl ether | 8.0 | 33 | 37 | 4 |
| POE oleic acid ester + POE nonylphenyl ether | 12.0 | 31 | 22 | 4 |
| POE oleic acid ester + POE nonylphenyl ether | 14.0 | 34 | 27 | 3 |
| Polyethylene glycol derivative | 11.6 | 33 | 14 | 9 |

TABLE 47

| Surface active agent (Addition of 200 ppm) | HLB | Surface tension (dyn/cm) | Contact angle (degree) | Number of particles (per ml) |
|---|---|---|---|---|
| POE alkylallyl ether | 16.0 | 38 | 42 | 5 |
| POE rauryl ether | 12.1 | 38 | 11 | 2 |
| POE rauryl ether | 15.3 | 36 | 44 | 2 |
| POE rauryl ether | 16.3 | 35 | 36 | 2 |
| POE rauryl ether | 17.0 | 42 | 49 | 2 |
| POE oleyl ether | 13.5 | 32 | 17 | 3 |
| POE oleyl ether | 16.2 | 37 | 39 | 3 |

TABLE 47-continued

| Surface active agent (Addition of 200 ppm) | HLB | Surface tension (dyn/cm) | Contact angle (degree) | Number of particles (per ml) |
|---|---|---|---|---|
| POE nonylphenyl ether | 10.8 | 35 | 21 | 6 |
| POE nonylphenyl ether + POE nonylphenyl ether | 12.0 | 31 | 13 | 4 |
| POE nonylphenyl ether | 13.7 | 32 | 26 | 5 |
| POE nonylphenyl ether | 15.1 | 34 | 31 | 3 |
| POE nonylphenyl ether | 15.5 | 32 | 36 | 3 |
| POE nonylphenyl ether | 14.5 | 36 | 28 | 3 |

TABLE 48

| Surface active agent (Addition of 200 ppm) | HLB | Surface tension (dyn/cm) | Contact angle (degree) | Number of particles (per ml) |
|---|---|---|---|---|
| POE oleic acid ester | 9.0 | 30 | 30 | 7 |
| POE oleic acid ester | 14.0 | 36 | 26 | 4 |
| POE nonylphenyl ether | 14.5 | 39 | 24 | 6 |
| POE higher alcohol ether | 10.5 | 28 | 22 | 8 |
| POE higher alcohol ether | 13.3 | 28 | 17 | 2 |
| POE octylphenyl ether | 13.1 | 29 | 21 | 5 |
| POE oleyl ether + POE nonylphenyl ether | 10.0 | 27 | 22 | 8 |
| POE oleyl ether + POE nonylphenyl ether | 7.0 | 41 | 46 | 4 |
| POE oleyl ether + POE nonylphenyl ether | 14.0 | 39 | 31 | 6 |
| POE oleic acid ester + POE nonylphenyl ether | 8.0 | 34 | 37 | 6 |
| POE oleic acid ester + POE nonylphenyl ether | 12.0 | 30 | 10 | 4 |
| POE oleic acid ester + POE nonylphenyl ether | 14.0 | 35 | 28 | 1 |
| Polyethylene glycol derivative | 11.6 | 36 | 15 | 8 |

Tables 45 and 46 show the result achieved with the 10-fold dilution of the treating composition (50.0 wt. % HF), and Tables 47 and 48 show result obtained with the 100-fold dilution of like composition. POE in these tables stands for polyoxyethylene.

What is claimed is:

1. A micro processing surface treating composition having an excellent wetting property and consisting essentially of hydrofluoric acid and a hydrocarbon nonionic surfactant having an HLB value of 7 to 17.

2. A micro processing surface treating composition according to claim 1 in which the hydrocarbon nonionic surfactant is at least one species selected from the group consisting of polyoxyethylene higher alcohol ether, polyoxyethylene oleic acid ester, polyoxyethylene lauryl ether, polyoxyethylene nonyl phenyl ether, polyoxyethylene octyl phenyl ether and polyoxyethylene alkyl allyl ether.

3. A micro processing surface treating composition according to claim 1 in which the hydrocarbon nonionic surfactant is incorporated in an amount of 10~1000 ppm.

4. A micro processing surface treating composition according to claim 1 in which the HLB value of a hydrocarbon nonionic surfactant is 10 to 15.

* * * * *